United States Patent
Butler et al.

(10) Patent No.: US 6,205,186 B1
(45) Date of Patent: Mar. 20, 2001

(54) DECODING WITH PARTIAL STATE INFORMATION ON A CONVOLUTIONALLY ENCODED CHANNEL

(75) Inventors: Brian K. Butler, La Jolla; Gwain Bayley, San Digeo; David Hansquine, San Diego; Edward G. Tiedemann, Jr., San Diego, all of CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 08/922,720

(22) Filed: Sep. 3, 1997

(51) Int. Cl.[7] .................................................. H04L 1/00
(52) U.S. Cl. ............................................................... 375/341
(58) Field of Search ..................................... 375/261, 262, 375/316, 340, 341, 130; 371/43.1, 43.7, 43.8; 455/458, 522, 38.3; 714/752, 758, 786; 370/311, 342, 320

(56) References Cited

U.S. PATENT DOCUMENTS

| 5,566,206 | 10/1996 | Butler et al. ............................ 375/225 |
| 5,673,291 | * 9/1997 | Dent ....................................... 375/262 |
| 5,687,188 | * 11/1997 | Feeney et al. .......................... 375/220 |
| 5,712,880 | * 1/1998 | Rim et al. .............................. 375/341 |
| 5,912,908 | * 6/1999 | Cesari et al. .......................... 371/43.7 |
| 6,029,268 | * 2/2000 | Kong et al. ............................ 714/795 |
| 6,044,069 | * 3/2000 | Wan ....................................... 370/311 |

* cited by examiner

Primary Examiner—Tesfaldet Bocure
(74) Attorney, Agent, or Firm—Philip R. Wadsworth; Kyong H. Macek

(57) ABSTRACT

The certainties of transmitted bits at predetermined locations in time are determine a priori. This information is then used to set the states of a Viterbi decoder to different state metrics in accordance with the certainties of the transmitted bits. High certainty of a transmitted bit results in resetting the states corresponding to that bit to a high state metric. In contrast, low certainty of a transmitted bit results in resetting the states corresponding to that bit to a low state metric. Resetting the states to different state metrics improves the decoding performance and shortens the time required to converge the decoding trellis by eliminating improbable paths.

30 Claims, 4 Drawing Sheets

DECODING WITH PARTIAL STATE INFORMATION ON A CONVOLUTIONALLY ENCODED CHANNEL

BACKGROUND OF THE INVENTION

I. Field of the Invention

The present invention relates to communications. More particularly, the present invention relates to a method for decoding with partial state information on a convolutionally encoded channel.

II. Description of the Related Art

The use of code division multiple access (CDMA) modulation techniques is one of several techniques for facilitating communications in which a large number of system users are present. Although other techniques such as time division multiple access (TDMA), frequency division multiple access (FDMA), and AM modulation schemes such as amplitude companded single sideband (ACSSB) are known, CDMA has significant advantages over these other techniques. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS," and assigned to the assignee of the present invention and incorporated by reference herein. The use of CDMA techniques in a multiple access communication system is further disclosed in U.S. Pat. No. 5,103,459, entitled "SYSTEM AND METHOD FOR GENERATING SIGNAL WAVEFORMS IN A CDMA CELLULAR TELEPHONE SYSTEM", assigned to the assignee of the present invention and incorporated by reference herein. The CDMA system can be designed to conform to the "TIA/EIA/IS-95 Mobile Station-Base Station Compatibility Standard for Dual-Mode Wideband Spread Spectrum Cellular System", hereinafter referred to as the IS-95 standard. Another code division multiple access communication system includes the GLOBALSTAR communication system for world wide communication utilizing low earth orbiting satellites.

In accordance with the IS-95 standard, a paging channel is used to transmit paging messages from the base station to the remote stations. The paging messages can be broadcast messages directed toward all remote stations or specific messages directed at a particular remote station. Paging messages can be used to alert the remote station of a pending communication with the base station or to transmit small amounts of data.

For wireless communication systems, such as the CDMA, TDMA, and GLOBALSTAR systems, slotted mode paging is utilized to minimize battery power consumption and improve standby time. For slotted mode paging, each remote station is assigned paging slots which can be selected in accordance with the phone number of the remote station. To conserve battery power, many functional blocks within the remote station are turned off or placed in the sleep mode for the duration between the assigned slots. Prior to the start of the assigned slots, the remote station is activated. In the awake mode, the remote station initializes the functional blocks to prepare for demodulation and decoding of the assigned slot for paging messages.

In accordance with IS-95 standard, the paging channel is convolutionally encoded to provide forward error correction capability. A rate 1/N convolutional encoder encodes each input bit into N code symbols called a code branch in accordance with a set of N generator polynomials. Each generator polynomial G(x) computes one code symbol. The N code symbols are combined into an N-bit code branch. Since each input bit is encoded into N code symbols, the code rate for the convolutional encoder is 1/N.

The constraint length K of the encoder is the number of data bits used in the encoding process and determines the error correcting capability of the code. Long constraint length K yields improved performance at the expense of hardware and computational complexity. A state in the convolutional encoder is designated by the K−1 prior input bits into the encoder. For a constraint length K encoder, there are $2^{K-1}$ possible states. For each of the $2^{K-1}$ states, a '0' or '1' input bit results in one of two possible code branches.

Typically, a Viterbi decoder is used to decode the transmitted code branches at the receiver. A discussion on the theory and operation of the Viterbi decoder is contained in the paper "Convolutional Codes and Their Performance in Communication Systems" by A. Viterbi, IEEE Transaction on Communication Technology, Vol. COM19, no. 5, October 1971, pgs. 821–835. Under certain assumptions about the channel noise, the Viterbi decoder performs the maximum likelihood decoding of the transmitted data sequence. For each received N code symbols, the branch metric of all branches entering each state is computed and added to the corresponding prior path metrics. The best path entering each state is selected and stored as the new path metrics. The path metric is also referred to as the state metric in the art. The selected path is stored in a path memory. In "Development of Variable Rate Viterbi Decoder and its Performance Characteristics," Sixth International Conference on Digital Satellite Communications, Phoenix, Ariz., September 1983, Y. Yasuda et al. show that the survivor paths with the best path metric all converge to the same path after a certain chain back depth. Thus, a Viterbi decoded bit is obtained by tracing a path back by at least the chain back distance.

In accordance with IS-95 standard, the paging channel is convolutionally encoded with a rate 1/2, constraint length K=9 convolutional encoder. However, unlike the forward traffic channel, the convolutional encoder for the paging channel is not flushed with K−1 code tail bits at the end of each 20 msec frame. Therefore, at the remote station, the Viterbi decoder is not able to reset to a known state at the start of each frame. Instead, the Viterbi decoder is operated for a predetermined amount of time prior to the start of the assigned slot to allow convergence of the decoding trellis. The duration of time the remote station is activated prior to the assigned slot represents a waste of battery power which shortens the standby time of the remote station.

SUMMARY OF THE INVENTION

The present invention is a novel and improved method for decoding a convolutionally encoded channel with partial state information. In the present invention, the certainties of transmitted bits at predetermined locations in time can be ascertained a priori. This information is then used to set the states of a Viterbi decoder to different state metrics in accordance with the certainties of the transmitted bits. High certainty of a transmitted bit results in resetting the states corresponding to that bit to a very good state metric. In contrast, low certainty of a transmitted bit results in resetting the states corresponding to that bit to a very bad state metric. Resetting the states to different state metrics improves the decoding performance and shortens the time required to converge the decoding trellis by eliminating improbable paths.

The present invention is especially applicable to a CDMA paging channel wherein slotted mode paging is used and each receiving remote station is assigned paging slots which are spaced apart in time. In the exemplary embodiment, there is a high probability that the M bits immediately prior to the start of the assigned slots are known a priori. In he exemplary IS-95 system, these bits can be zero padding bits. In fact, the IS-95 system can be operated to ensure that the M bits immediately prior to the start of the assigned slots are zero padding bits. This information is used to reset the states within the Viterbi decoder accordingly. The improved decoding performance as the result of the partial state reset includes shortened initialization time and lower probability of decoding error.

It is an object of the present invention to improve decoding performance by utilizing a priori knowledge that the four bits immediately prior to the assigned slot are very likely or most definitely known. For the exemplary IS-95 system, the high probability or absolute certainty that these four bits are padding bits result from the unique structure of the paging channel message capsule, as defined by IS-95 standard or by system design, respectively. This information is used to reset states 0 through 15 within Viterbi decoder to the best or a very good state metric and states 16 through 255 to the worst or a very bad state metric. By eliminating over 93 percent of possible states from consideration, the decoding performance is improved.

It is another object of the present invention to improve decoding performance by utilizing a priori knowledge that the three bits immediately prior to the assigned slot have a high probability of being zero padding bits. This certainty is ascertained by the unique structure of the paging channel message capsule as specified by IS-95 standard. This information is used to reset states 0 through 31 within Viterbi decoder to the best or a very good state metric and states 32 through 255 to the worst or a very bad state metric. By eliminating over 87 percent of possible states from consideration, the decoding performance is improved.

It is yet another object of the present invention to improve decoding performance by utilizing a priori knowledge that the transmitted bits closest to the assigned slot have increasing probability of being zero padding bits. Again, this certainty is ascertained by the unique structure of the paging channel message capsule as specified by IS-95 standard. This information is used to reset states 0 through 7 within Viterbi decoder to the best state metric, states 8 through 15 to a very good metric, states 16 through 31 to a good metric, states 32 through 63 to a medium metric, states 64 through 127 to a very bad metric, and states 128 through 255 to the worst state metric. By resetting the states to a range of state metrics in accordance with the certainties of the bits being zero padding bits, improved decoding performance is obtained.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is a method for decoding a convolutionally encoded channel with partial state information. The present invention utilizes the information that a predetermined number of bits immediately prior to the start of the message to be decoded are known with some level of certainty. This information is used to partially reset the states within the Viterbi decoder at the remote station to different state metrics and to eliminate improbable states from consideration. The eliminated states can comprise a large percentage of the possible states. Thus, the partial reset improves the Viterbi decoding process while reducing the time required to demodulate a channel which has been convolutionally encoded.

The present invention is well suited for slotted mode paging in an IS-95 CDMA system wherein paging messages are transmitted to the remote station at predetermined time slots. The partial reset of the Viterbi decoder minimizes the required initialization time, thereby reducing battery consumption and extending standby time. The partial reset also improves the decoding performance by assigning favorable weights to probable paths and unfavorable weights to improbable paths.

Figure 1:
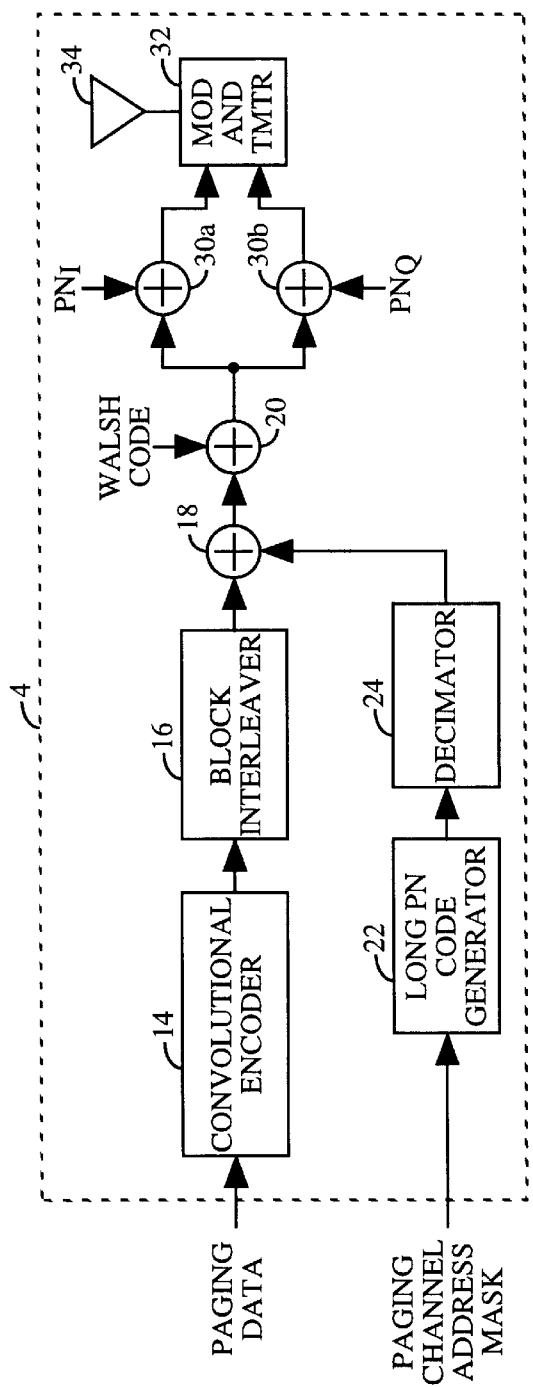
FIG. 1 is a block diagram of an exemplary convolutionally encoded channel.

Referring to the figures, FIG. 1 illustrates an exemplary convolutionally encoded channel. One such channel is the paging channel of an IS-95 CDMA system. The paging channel data is provided to convolutional encoder 14 which encodes the data with a convolutional code. In the exemplary embodiment, the paging channel data comprises paging messages, CRC parity bits, synchronized capsule indicator (SCI) bits, and other overhead bits. The paging channel data format is described below. In the exemplary embodiment, convolutional encoder 14 is a rate 1/2, constraint length K=9 encoder as defined by IS-95 standard. The encoded data is provided to block interleaver 16 which reorders (or interleaves) the code symbols. In the exemplary embodiment, block interleaver 16 interleaves blocks of 20 msec. Thus, the encoded data is partitioned into 20 msec blocks and the symbols within the 20 msec block are interleaved. The interleaved data is provided to summer 18 which scrambles the data with a long pseudo noise (PN) sequence from decimator 24. The long PN sequence is generated by long PN code generator 22 and masked with the paging channel address mask to identify the transmitting base station 4 and the paging channel number. The scrambled data is provided to summer 20 which covers the data with the Walsh code corresponding to the paging channel. The covered data is provided to summers 30a and 30b which spread the data with the short $PN_I$ and $PN_Q$ sequences, respectively. The spread data is provided to modulator and transmitter (MOD AND TMTR) 32 which modulates, upconverts, filters, and amplifies the signal. The forward link signal is transmitted on the forward link through antenna 34.

Figure 2:
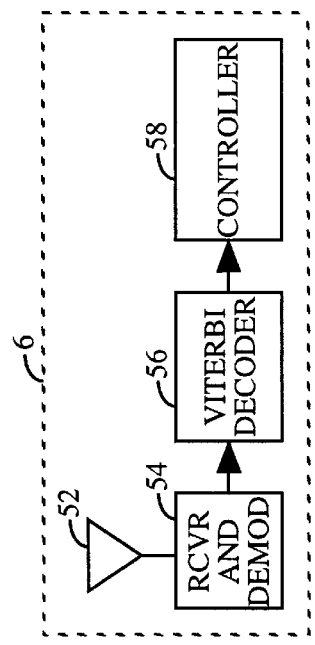
FIG. 2 is a block diagram of an exemplary architecture used to decode a convolutionally encoded channel.

FIG. 2 illustrates an exemplary architecture used to decode a convolutionally encoded channel. At remote station 6, the forward link signal is received by antenna 52 and routed to receiver and demodulator (RCVR AND DEMOD) 54 which amplifies, filters, downconverts, demodulates, and quantizes the forward link signal to provide digitized data.

The digitized data is provided to Viterbi decoder 56 which convolutionally decodes the data in accordance with the parameters associated with the convolutional encoder used at the transmitting base station 4. The decoded data is provided to controller 58. Controller 58 scans the SCI bits and assembles the paging messages based on the length field then performs the CRC check of the paging messages. Controller 58 can be implemented in a microcontroller, a microprocessor, a digital signal processing (DSP) chip, or an ASIC programmed to perform the function as described herein.

Figure 3:
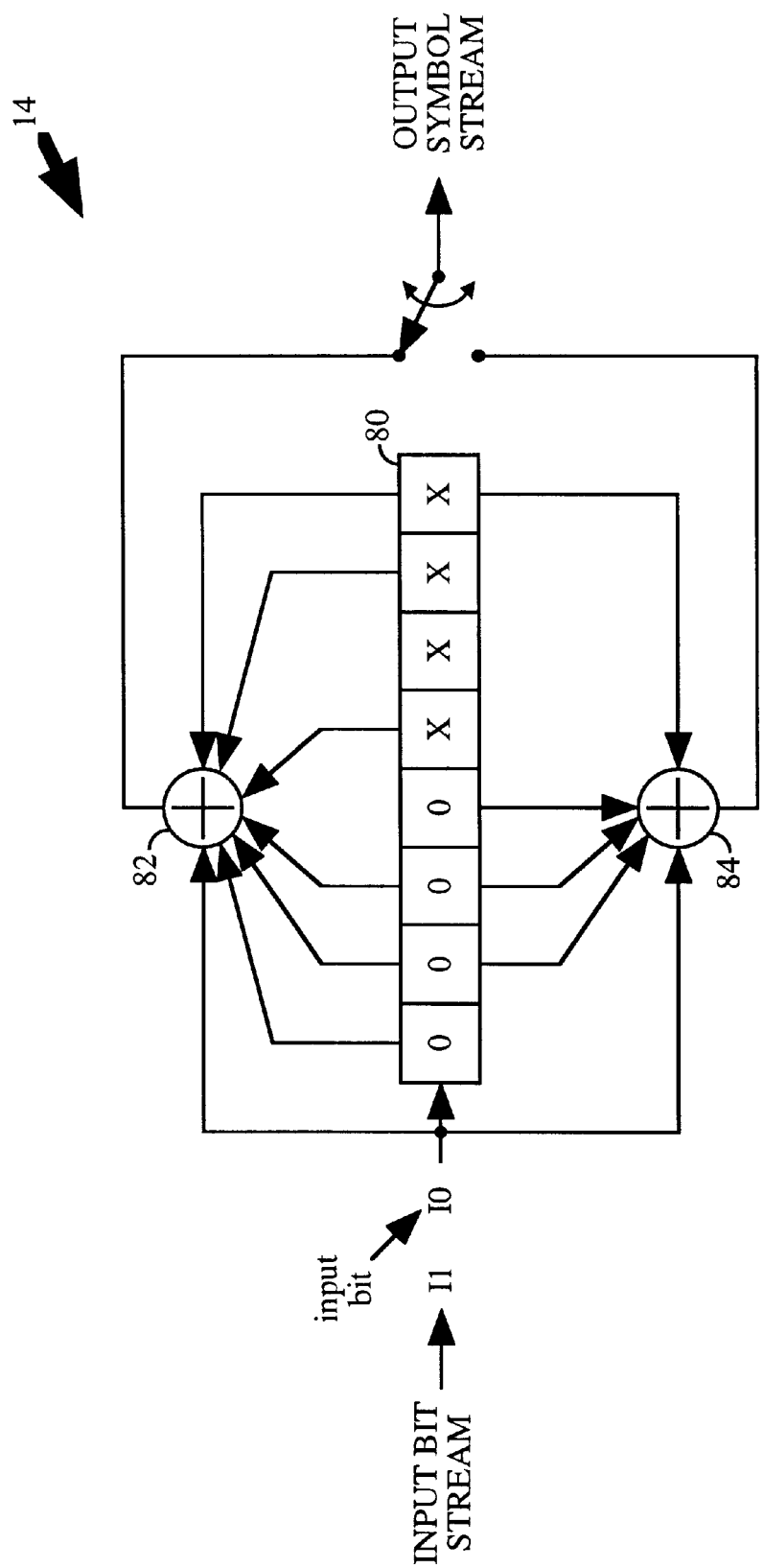
FIG. 3 is a diagram of an exemplary convolutional encoder.

A diagram of an exemplary convolutional encoder is shown in FIG. 3. In the exemplary embodiment, convolutional encoder 14 is a rate 1/2, constraint length K=9 convolutional encoder which is defined by the generator polynomials G1(x)=753 (octal) and G2(x)=561 (octal). Register 80 comprises K−1 bits for the K−1 most recent input bits into convolutional encoder 14. Each additional input bit results in two code symbols, one from summer 82 and another from summer 84. The taps corresponding to summer 82 are defined by the generator polynomial G1(x) and the taps corresponding to summer 84 are defined by G2(x). The K−1 bits within register 80 define the state of convolutional encoder 14.

Figure 4:
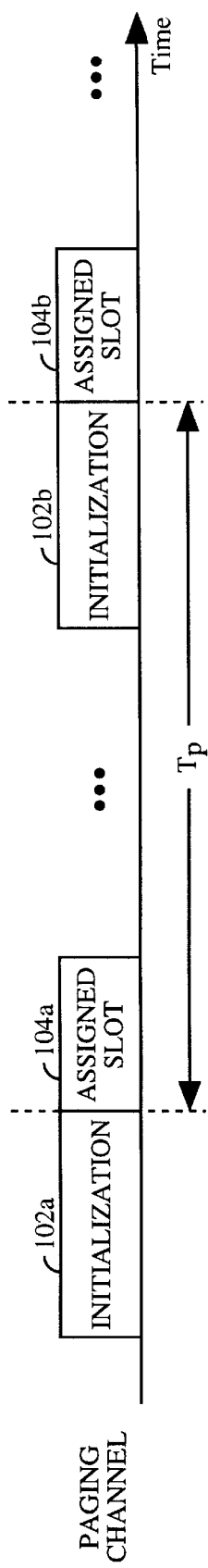
FIG. 4 is a timing diagram of an exemplary paging channel.

A timing diagram of an exemplary paging channel is shown in FIG. 4. For slotted mode paging, the paging messages for a specific remote station 6 are transmitted at predetermined slots. In the exemplary embodiment, each remote station 6 is assigned paging slots based on the phone number of remote station 6. In the exemplary embodiment, the assigned slots are separated by an interval of $T_p$=1.28 sec×$2^{SCindex}$, where SCindex is equal to 0, 1, 2, . . . depending on remote station 6 and the network wherein remote station 6 is deployed. Thus, the interval between assigned slots can be 1.28 sec, 2.56 sec, 5.12 sec or more.

For most of the duration between the assigned slots, remote station 6 is placed in the sleep mode and many functional blocks within remote station 6 are turned off to conserve battery power. Remote station 6 is activated prior to each assigned slot to retrieve paging messages. In accordance with IS-95 standard, each assigned slot comprises four paging channel frames, each 20 msec in length. Each paging channel frame is further divided into two 10 msec paging channel half frames. In accordance with IS-95 standard, the first bit in any paging channel half frame comprises a SCI bit which indicates the state of the succeeding half frame. In the exemplary embodiment, a "1" for the SCI bit indicates that a new message starts in the following bit and a "0" for the SCI bit indicates that the following bit contains the continuation of the current paging message. Although the assigned slots are 80 msec in duration, the paging messages can exceed 80 msec for long messages or the paging messages can be less than 80 msec for short messages. Depending on the content of the decoded paging message, remote station 6 can continue to decode or revert back to the sleep mode.

In accordance with IS-95 standard, a paging message or paging channel message capsule can be one of two types: synchronized and unsynchronized. Synchronized message capsules are transmitted starting at the second bit of a paging channel half frame and unsynchronized message capsules can be transmitted starting immediately following the prior message capsule. In accordance with IS-95 standard, if after the end of a paging channel message capsule there remains 8 bits or more before the next SCI bit, an unsynchronized message capsule may be transmitted immediately following that message capsule. No padding bits are included in a message capsule followed by an unsynchronized message capsule. In accordance with IS-95 standard, if after the end of the a paging channel message capsule there remains fewer than 8 bits before the next SCI bit, or if no unsynchronized message capsule is transmitted following a paging channel message capsule, sufficient padding bits are included to extend that message capsule to the next SCI bit. A synchronized message capsule is then transmitted following that SCI bit. In accordance with IS-95 standard, the padding bits are defined to be set to zero.

Figure 5:
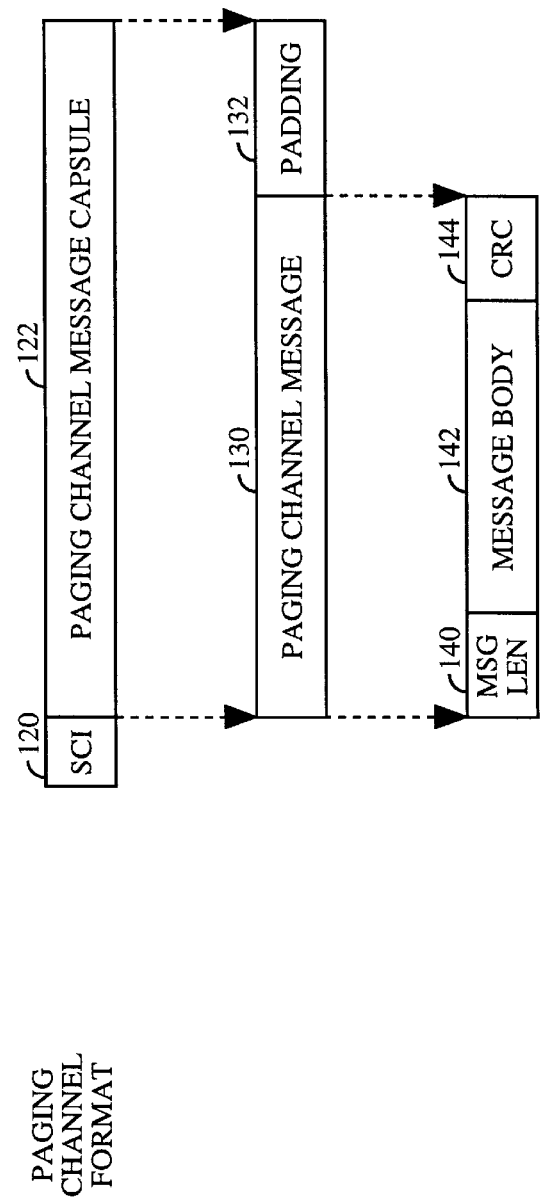
FIG. 5 is a diagram of an exemplary paging channel message capsule.

A diagram of an exemplary message capsule is shown in FIG. 5. As shown in FIG. 5, synchronized paging channel message capsule 122 immediately follows SCI bit 120. For long message capsules which extend over one paging channel half frame, other SCI bits 120 are interposed within the message capsule and are extracted during the decoding process. Paging channel message capsule 122 comprises paging channel message 130 and padding bits 132. Paging channel message 130 comprises message length (MSG LEN) field 140, message body 142, and CRC parity bits (CRC) 144.

In the exemplary embodiment, remote station 6 is activated prior to the assigned slots to initialize the hardware within remote station 6. The initialization can comprise retuning the frequency synthesizer to the proper channel, placing the analog circuits to the proper settings, resetting the timing chains, synchronizing the PN generators, and performing partial search and re-acquisition of the forward link signals. The demodulated symbols from demodulator 54 are provided to Viterbi decoder 56 which starts the decoding process (see FIG. 2).

In accordance with IS-95 standard, the paging channel is convolutionally encoded with a rate 1/2, constraint length K=9, convolutional encoder. For a rate 1/N encoder, N code symbols are generated for each information bit. These code symbols are a function of the new information bit and the previous K−1 bits, resulting in an encoder that is in one of $2^{K-1}$ states at each bit time. In the prior art, receiving the IS-95 paging channel slot requires remote station 6 to receive and decode the previous 20 msec frame to insure the convergence of the state metrics for acceptable performance. This results from the need to have several multiples of the constraint length worth of bits be processed by Viterbi decoder 56 and these bits are interleaved across most of the previous 20 msec frame in accordance with IS-95 standard. Thus, in the prior art, it is necessary to demodulate nearly the entire 20 msec frame prior to the assigned slot.

In the exemplary embodiment, the value of the state metrics are limited to a predefined range from 0 to 31. Using five bits to represent the state metrics reduces the memory requirement. In the exemplary embodiment, the state metrics are re-normalized after very bit time by the lowest (best) state metric to reduce the value of the state metrics. Using five bits, the state metrics can range from 0 to 31. In the exemplary embodiment, a state metric of zero corresponds to the best state metric and a state metric of 31 corresponds to the worst state metric. As used in this specification, the states are assigned to one of a number of possible state metrics which are defined in increasingly worse order as: best, very good, good, medium, very bad, and worst. Using five bits, the state metrics can be defined as: 0=best≦very good≦good≦medium≦very bad≦worst=31. Different number of bits to represent the state metrics and assignment of various values to each state metric can be contemplated and are within the scope of the present invention.

In the exemplary embodiment, a state is defined by the K−1 previous information bits within convolutional encoder 14 as shown in FIG. 3. For each new information bit, the content of the K–1 bit register 80 shifts to the right by one bit. As shown in FIG. 3, if the four leftmost bits are zeros (e.g. '0000XXXX'$_2$), convolutional encoder 14 can take on any state from 0 through $15_{10}$, where the subscript denotes the base of the number. Different definitions of the states can be utilized and are within the scope of the present invention.

In the present invention, by resetting the states within Viterbi decoder 56 to various state metrics based on a priori knowledge of the value of the bits immediately prior to the start of the assigned slot, the demodulation of the paging channel frame prior to the assigned slot for the purpose of decoder state convergence can be eliminated. The present invention can be practiced by at least three embodiments which are described in detail below.

In the first embodiment, there is a high probability or absolute certainty that the four bits immediately prior to the assigned slot, when it coincides with the start of a synchronized capsule, are zero. This can be ascertained by the unique structure of the paging channel message capsule, as specified by IS-95 standard. Alternatively, a mechanism can be maintained at the transmitting base station 4 to ensure that these four bits are always set to zero. Viterbi decoder 56 utilizes this information to reset states 0 through 15 to the best or a very good state metric and states 16 through 255 to the worst or a very bad state metric. Thus, with four known bits, over 93 percent of the possible states can be eliminated from consideration in the Viterbi decoding process.

In the second embodiment, the bits immediately prior to the assigned slots are not systematically set to zero. These bits comprise a part of the prior message capsule. However, because of the unique structure of the paging message as defined by the IS-95 standard and described below, these bits are likely to be zero padding bits. In the second embodiment, the three bits immediately prior to the assigned slots are presumed to be zero padding bits. Presumption of these three bits being zero is used to reset states 0 through 31 within Viterbi decoder 56 to the best or a very good state metric and states 32 through 255 to the worst or a very bad state metric. Thus, with three presumed bits, over 87 percent of the possible states can be eliminated from consideration in the Viterbi decoding process.

And in the third embodiment, the bits immediately prior to the assigned slots are presumed to be zero padding bits with varying certainty. In the exemplary third embodiment, the probability of the bit closest to the assigned slot being zero is very high. Thus, states 128 through 255 are reset to the worst state metric. The probability of the second immediately adjacent bit to the assigned slot being zero is almost as high. Thus, states 64 through 127 are reset to a very bad state metric. The probability of the third closest bit to the assigned slot being zero is likely. Thus, states 32 through 63 are reset to a medium state metric. The probability of the fourth closest bit to the assigned slot being zero is less likely. Thus, states 15 through 31 are reset to a good state metric. The probability of the fifth closest bit to the assigned slot being zero is even less likely. Thus, states 8 through 15 are reset to a very good state metric. States 0 through 7 are reset to the best state metric, since it is more likely that there were 5 to 8 zeros immediately preceding the assigned slot. Thus, the states within the decoding trellis are assigned various state metrics depending on the certainty of the existence of the padding bits.

Additional embodiments can be derived from the three embodiments described above. For example, the probability of each of the K–1 bits immediately prior to the assigned slot being a padding bit can be computed for a given system and the state metric assigned to each state can be dependent on the computed probabilities. Thus, up to K different state metrics can be assigned to K sets of state corresponding to the probability of each of the K–1 bits immediately prior to the assigned slot being a padding bit. As a subset of the above discussion, if M bits are known to be padding bits, then $2^{(K-1-M)}$ corresponding states can be reset to the best or very good state metric and $(2^{K-1}-2^{K-1-M})$ remaining states can be reset to the worst or very bad state metric. Also, all $2^{K-1}$ state metrics corresponding to the probability of each permutation of the K–1 bits immediately prior to the assigned slot can be computed. The use of any number of state metrics for any number of sets of state can be utilized and are within the scope of the present invention.

In the exemplary embodiment, the state of convolutional encoder 14 is defined in accordance with the content of register 80 as shown in FIG. 3. Thus, for four zero padding bits, states 0 through 15 are reset to the best or very good state metric. However, if the content of these four bits are known to be some other value, a different corresponding set of state are reset to the best or very good state metric. Thus, it is important that the content of each bit is known with certainty, but the content of each bit itself is not important. Stated differently, it does not matter whether the bit is zero or one, but it does matter that, whatever the content is, it is known with a high degree of certainty.

The effectiveness of the present invention can be appreciated by analyzing the structure of the paging message. As defined by IS-95 standard, each paging channel half frame (10 msec) comprises 95 or 47 bits (plus one SCI bit) depending upon whether a 9600 bps or 4800 bps paging channel is used. IS-95 further specifies that each paging channel message capsule must be an integer multiple of eight bits in length. However, each paging channel half frame contains seven bits beyond an integer multiple of eight bits. Thus, the final bits of a paging channel half frame prior to a new synchronized paging message are rarely used. For example, if the previous message capsule was synchronized 10 msec before the assigned slot, there would be 7, 15, or more bits of padding prior to the assigned slot. Similarly, if the previous message capsule was synchronized 20 msec before the assigned slot, there would be 6, 14, or more bits of padding. This process can be continued and it can be shown that if the previous message capsule was synchronized 50 msec, 60 msec, 70 msec, 80 msec, 130 msec, 140 msec, 150 msec, 160 msec, 210 msec, and so on, before the assigned slot, there is a possibility of less than four padding bits prior to the assigned slot. Although the possibility exists, paging channel message capsule having less than four padding bits rarely occur. To take advantage of this fact, the communication system can be operated to ensure that four (or any number of bits M) immediately prior to the assigned slot are padding bits. If there are less than four padding bits, the system can delay the transmission of the next paging message capsule by a half frame. These operating conditions have minimal effect on the efficiency of the paging channel.

In the present invention, Viterbi decoder 56 is activated at the start of the assigned slot. Viterbi decoder 56 reset the states within the decoding trellis in accordance with one of the embodiments described above. Viterbi decoder 56 then begins decoding the paging channel for message capsules. In most cases, the bits immediately prior to the assigned slot are padding bits and Viterbi decoder 56 performs as expected. However, in several scenarios, the padding bits may not be present as expected. These scenarios are discussed below.

In the first scenario, the start of the assigned slot comprises the continuation of a prior message capsule. In accordance with IS-95 standard, the message capsule can finish anywhere in time and can run into the assigned slot. When this occurs, the bits immediately prior to the start of the assigned slot are not likely to be zero. Thus, the states within Viterbi decoder 56 may have been reset to the wrong state metrics. Viterbi decoder 56 decodes the bit stream and, with each new bit, moves closer toward convergence. If the next message capsule is synchronized (as required by the IS-95 standard) to a subsequent paging channel half frame, Viterbi decoder 56 will converge before the start of this message capsule.

In the second scenario, the prior message capsule ends within M bits of the start of the assigned slot and insertion of M padding bits is not possible, where M is four in the exemplary embodiment. Two embodiments can be utilized to address this scenario. In the first embodiment, the next message capsule can be started at the next paging channel half frame. This ensures that Viterbi decoder 56 will converge before the start of the new message capsule. However, this results in slight inefficiency since a half frame of padding is transmitted. In the second embodiment, the next message capsule can be transmitted at the start of the assigned slot after the SCI bit even though the prior message capsule ends within M bits of the start of the assigned slot. In this case, a higher probability of decoding error exists because the states within Viterbi decoder 56 may have been reset to erroneous state metrics. In some communication system, the higher probability of error can be tolerated. For the second scenario, the communication system can be designed to transmit at the next half frame or at the assigned slot, depending on the system requirement. For either embodiment, the impact in system performance is small since these situations rarely occur in practice.

In the prior art, for an exemplary CDMA communication system, the average initiation time and decoding time required to decode paging messages total 63 msec. The present invention produces a saving of 20 msec since the demodulation of the prior paging channel frame is not necessary. The shorter awake time reduces battery consumption and improves standby time. Standby time for an exemplary remote station design can be calculated as:

$$ST = \frac{\text{Battery Capacity}}{f_{awake} I_{awake} + f_{sleep} I_{sleep}}, \quad (1)$$

where ST is the standby time, $f_{awake}$ and $f_{sleep}$ are the fraction of time spent in the awake and sleep states, respectively, and $I_{awake}$ and $I_{sleep}$ are the current consumptions in the awake and sleep states, respectively. The improvement in standby time with the present invention can be calculated as:

$$ST_{improve} = \frac{ST_2 - ST_1}{ST_1} = \frac{1 + f_{awake,1}(\alpha - 1)}{1 + f_{awake,2}(\alpha - 1)} - 1, \quad (2)$$

where $ST_{improve}$ is the relative improvement in standby time with the present invention, $ST_1$ and $ST_2$ are the standby times of the prior art and the present invention, respectively, and $$\alpha \equiv \frac{I_{awake}}{I_{sleep}}.$$

Figure 6:
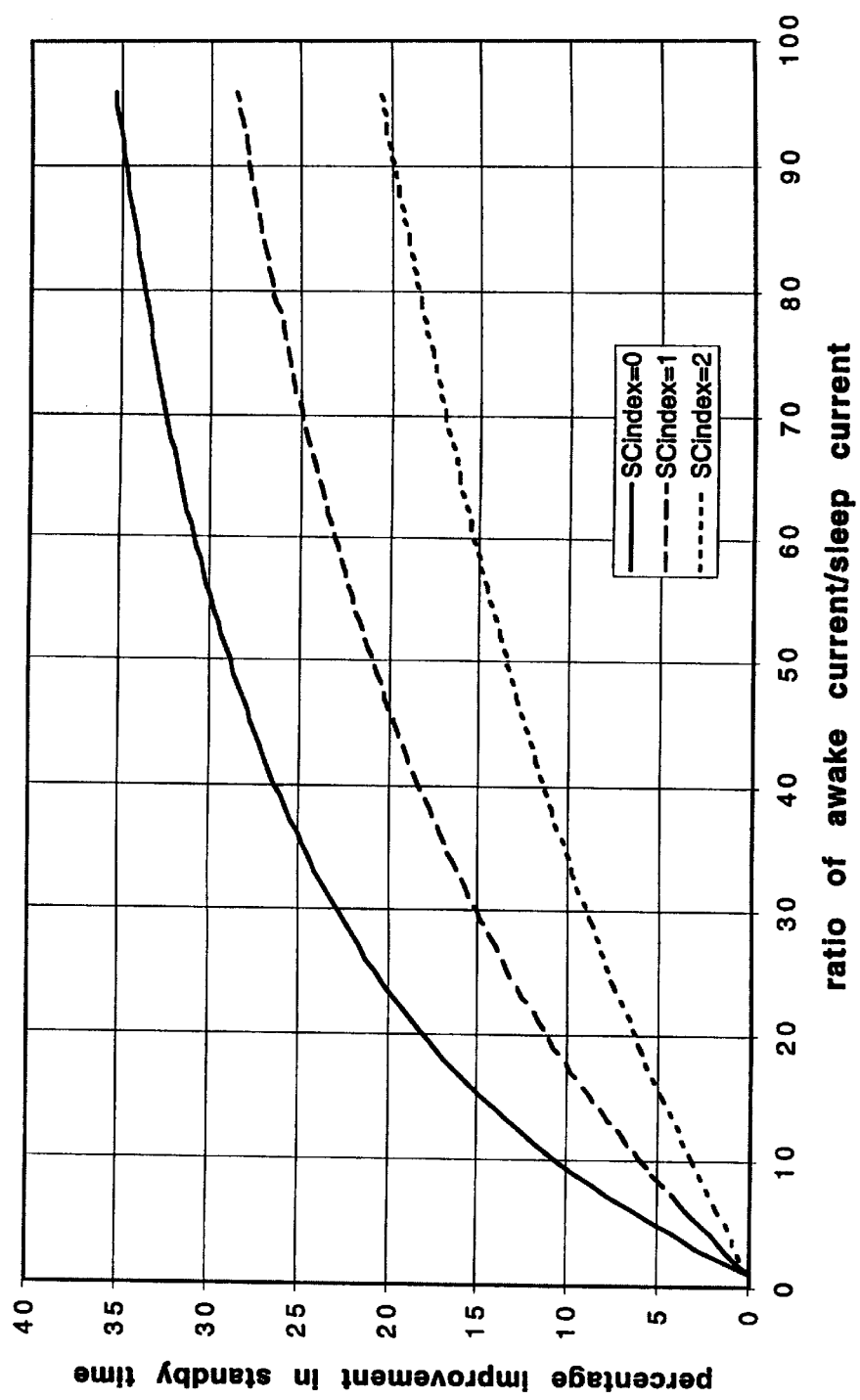
FIG. 6 is a graph of the possible improvement in standby time by utilizing the present invention.

$\alpha$ is dictated by the design of a particular remote station 6. Equation (2) is plotted in FIG. 6 where the vertical axis is the percentage improvement produced by the present invention for SCindex of 0, 1, and 2 (1.28 sec, 2.56 sec, and 5.12 sec). FIG. 6 assumes a 43 msec awake time for the present invention, and a 63 msec awake time for the prior art for each assigned paging slot. As the interval between assigned slots decreases or the awake time decreases, the improvement with the present invention is more pronounced.

In accordance with IS-95 standard, the padding bits are set to zero. However, for other communication systems, the padding bits can be set to other values or pattern. The present invention can be applied to any system wherein the value or pattern of the padding bits, or bits immediately prior to the assigned slots, are known a priori. The present invention can be utilized to set the states of a Viterbi decoder to different state metrics in accordance with the certainties of the transmitted bits. In accordance with IS-95 systems, the zero bits are used to allow the receiver to determine that an unsynchronized paging message does not follow.

The present invention can be easily extended from the description above to other code rates, such as the rate (n−1)/n punctured convolutional codes. Punctured codes are described in "Punctured Convolutional Codes of Rate (n−1)/n and Simplified Maximum Likelihood Decoding" by J. B. Cain, G. C. Clark, Jr, and J. M. Geist, IEEE Transaction on Information Theory, IT-25, January 1979, pgs. 97–100 and "High-Rate Punctured Convolutional Codes for Soft Decision Viterbi Decoding" by Y. Yasuda, K. Kashusi, and Y. Hirata, IEEE Transaction on Communications, COM. 32, March 1984, pgs. 315–319. This technique creates codes of rate 2/3, 3/4, 4/5, 6/7, 6/7, and so on, from a basic rate 1/2 code by simply not transmitting predefined code symbols.

Although the present invention has been described in the context of a paging channel in an IS-95 CDMA communication system, the present invention can be practiced on any convolutionally encoded channel. The present invention can be applied to any communication which performs discontinuous reception. In particular, the present invention is applicable to slotted mode paging which is utilized in many wireless communication system, including but not limited to CDMA, TDMA, and GLOBALSTAR communication systems. Thus, application of the concept described herein to other communication systems and other data transmission systems can be contemplated and are within the scope of the present invention.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A method for decoding convolutionally encoded channel comprising the steps of:

determining certainties of transmitted bits at predetermined locations in time;

resetting states within a Viterbi decoder corresponding to said transmitted bits with state metrics corresponding to said certainties;

decoding said channel with said state metrics.

2. The method of claim 1 wherein states within said Viterbi decoder corresponding to said transmitted bits are reset to a very good state metric corresponding to a high certainty for said transmitted bits.

3. The method of claim 1 wherein states within said Viterbi decoder corresponding to said transmitted bits are reset to a very bad state metric corresponding to a low certainty for said transmitted bits.

4. The method of claim 1 wherein certainties of four transmitted bits at said predetermined locations in time are determined.

5. The method of claim 1 wherein certainties of three transmitted bits at said predetermined locations in time are determined.

6. The method of claim 1 further comprising the step of:
setting a predetermined number of bits at said predetermined locations in time to zero padding bits.

7. The method of claim 6 wherein said predetermined number of bits is four.

8. The method of claim 6 wherein said predetermined number of bits is three.

9. The method of claim 1 wherein certainties of four transmitted bits immediately prior to a start of an assigned slot are determined.

10. The method of claim 1 wherein certainties of three transmitted bits immediately prior to a start of an assigned slot are determined.

11. The method of claim 1 further comprising the step of:
setting a predetermined number of bits immediately prior to a start of an assigned slot to zero padding bits.

12. The method of claim 11 wherein said predetermined number of bits is four.

13. The method of claim 11 wherein said predetermined number of bits is three.

14. A method for decoding convolutionally encoded paging channel in an IS95 communication system comprising the steps of:
determining certainties of transmitted bits immediately prior to an assigned slot;
resetting states within a Viterbi decoder corresponding to said transmitted bits with state metrics corresponding to said certainties;
decoding said paging channel with said state metrics.

15. The method of claim 14 wherein states within said Viterbi decoder corresponding to said transmitted bits are reset to a very good state metric corresponding to a high certainty for said transmitted bits.

16. The method of claim 14 wherein states within said Viterbi decoder corresponding to said transmitted bits are reset to a very bad state metric corresponding to a low certainty for said transmitted bits.

17. The method of claim 14 wherein certainties of four transmitted bits immediately prior to said assigned slot are determined.

18. The method of claim 14 wherein certainties of three transmitted bits immediately prior to said assigned slot are determined.

19. The method of claim 14 wherein state 0 through 15 within said Viterbi decoder are reset to a very good state metric and states 16 through 255 are reset to a very bad state metric.

20. The method of claim 14 wherein state 0 through 31 within said Viterbi decoder are reset to a very good state metric and states 32 through 255 are reset to a very bad state metric.

21. The method of claim 14 wherein state 0 through 7 within said Viterbi decoder are reset to a best state metric, states 8 through 15 are reset to a very good metric, states 16 through 31 are reset to a good metric, states 32 through 63 are reset to a medium metric, states 64 through 127 are reset to a very bad metric, and states 128 through 255 are reset to a worst state metric.

22. The method of claim 14 further comprising the step of:
transmitting at least a predetermined number of padding bits immediately prior to said assigned paging slot.

23. The method of claim 14 further comprising the step of:
transmitting at least a predetermined number of padding bits immediately prior to said assigned paging slot when a start of said assigned paging slot coincides with a start of a paging message.

24. The method of claim 23 wherein said predetermined number of bit is four.

25. The method of claim 23 wherein said predetermined number of bit is three.

26. The method of claim 14 further comprising the step of:
transmitting a paging channel message capsule at a next available paging channel half frame if less than a predetermined number of padding bits are transmitted immediately prior to said assigned paging slot.

27. The method of claim 26 wherein said predetermined number is four.

28. The method of claim 26 wherein said predetermined number is three.

29. The method of claim 14 wherein K sets of state are reset with up to K state metrics in accordance with said determined certainty of each of K−1 transmitted bits immediately prior to said assigned paging slot, wherein K is a constraint length of a convolutional encoder used to encode said paging channel.

30. The method of claim 29 wherein K is 9.

* * * * *